US010822096B2

(12) United States Patent
Yang et al.

(10) Patent No.: US 10,822,096 B2
(45) Date of Patent: Nov. 3, 2020

(54) AVIONICS COOLING MODULE

(71) Applicant: GE AVIATION SYSTEMS, LLC, Grand Rapids, MI (US)

(72) Inventors: Liqiang Yang, Pompano Beach, FL (US); Richard Anthony Eddins, Margate, FL (US); Darrell Lee Grimes, Boca Raton, FL (US)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 15/941,932

(22) Filed: Mar. 30, 2018

(65) Prior Publication Data

US 2019/0300180 A1    Oct. 3, 2019

(51) Int. Cl.
*H05K 7/20* (2006.01)
*B64D 13/08* (2006.01)

(52) U.S. Cl.
CPC .................................. *B64D 13/08* (2013.01)

(58) Field of Classification Search
None
See application file for complete search history.

(56) References Cited

U.S. PATENT DOCUMENTS

| | | | |
|---|---|---|---|
| 6,213,195 B1 * | 4/2001 | Downing | H01L 23/46 165/80.4 |
| 6,992,382 B2 | 1/2006 | Prasher | |
| 7,173,823 B1 * | 2/2007 | Rinehart | F28D 9/0031 165/80.4 |
| 7,177,153 B2 * | 2/2007 | Radosevich | B60L 15/007 361/699 |
| 7,353,859 B2 * | 4/2008 | Stevanovic | H01L 23/473 165/170 |
| 7,360,582 B2 | 4/2008 | Olesen | |
| 7,898,807 B2 | 3/2011 | Stevanovic | |
| 8,149,579 B2 * | 4/2012 | Jadric | H05K 7/20936 165/80.4 |
| 8,982,558 B2 * | 3/2015 | Beaupre | H01L 23/473 361/702 |
| 9,003,649 B1 * | 4/2015 | Romero | B23K 20/122 29/830 |
| 9,042,100 B2 * | 5/2015 | Kang | G06F 1/20 361/703 |

(Continued)

FOREIGN PATENT DOCUMENTS

| CN | 102016483 A | 4/2011 |
|---|---|---|
| CN | 102869236 A | 1/2013 |

(Continued)

OTHER PUBLICATIONS

Chinese Patent Office, Office Action re Corresponding Chinese Application No. 201910244360.9, dated Apr. 3, 2020, 11 pages, China.

*Primary Examiner* — Courtney L Smith
(74) *Attorney, Agent, or Firm* — McGarry Bair PC

(57) ABSTRACT

An apparatus and method relating to a cooling adapter having a housing with at least one mounting aperture and including at least one cooling manifold comprising an inlet plenum having at least one inlet for entry of a cooling fluid, an outlet plenum having at least one outlet for exhausting the cooling fluid, and a plurality of channels disposed between the inlet channel and the outlet channel for allowing the cooling fluid to move therebetween.

25 Claims, 8 Drawing Sheets

(56) References Cited

U.S. PATENT DOCUMENTS

| | | |
|---|---|---|
| 10,180,289 B2 | 1/2019 | Vanderwees et al. |
| 2007/0215325 A1 | 9/2007 | Kern |
| 2009/0294105 A1 | 12/2009 | Rao |
| 2011/0056668 A1 | 3/2011 | Taras et al. |
| 2012/0287577 A1* | 11/2012 | Sevakivi ............... H01L 23/473 361/702 |
| 2012/0327603 A1* | 12/2012 | Beaupre ................ H01L 23/473 361/702 |
| 2016/0345462 A1 | 11/2016 | Manninen |
| 2017/0055378 A1* | 2/2017 | Zhou .................. H05K 7/20927 |

FOREIGN PATENT DOCUMENTS

| | | |
|---|---|---|
| CN | 105940281 A | 9/2016 |
| JP | S61104645 A | 5/1986 |

\* cited by examiner

AVIONICS COOLING MODULE

BACKGROUND OF THE INVENTION

Power electronics refers to the application of solid-state electronics related to the control and conversion of electrical power. This conversion is typically performed by silicon, silicon carbide, and gallium nitride semiconductor devices that are packaged into power modules. One of the factors associated with power modules is the generation of heat. While the heat generated by the power modules is due to many factors, it generally relates an efficiency loss, typically generated as heat. Increased temperatures can result in an erosion of power module performance.

An additional factor for thermal management relates to the packaging of a number of devices in small footprints. The power density, at which the devices, and thus the module can operate, therefore depends on the ability to remove this generated heat. The common form of thermal management of power electronics is through heat sinks. Heat sinks operate by transferring the heat away from the heat source of the power module, thereby maintaining the heat source at a lower relative temperature. There are various types of heat sinks known in the thermal management field including air-cooled and liquid-cooled devices.

One example of the thermal management of a power module includes the attachment of a heat sink with embedded tubes to provide liquid cooling of the power module. The heat sink is typically a metallic structure, such as aluminum or copper. A cooling medium such as water is passed through the tubes to cool the power module. The heat sink is typically coupled to the power module base with a thermal interface material (TIM) dispersed there between. The thermal interface material may comprise thermal greases, compliant thermal pads, or the like. Typically the heat sink and TIM of the power module are interconnected, where both can include channels or tubes to enhance cooling of the power module.

BRIEF DESCRIPTION OF THE INVENTION

In one aspect, the present disclosure relates to a cooling adapter for an avionics system comprising a housing comprising at least one mounting aperture and including at least one cooling manifold comprising an inlet plenum having at least one inlet for entry of a cooling fluid, an outlet plenum having at least one outlet for exhausting the cooling fluid, and a plurality of channels disposed between the inlet plenum and the outlet plenum for allowing the cooling fluid to move therebetween, wherein the housing is configured to be removably attached to a pre-existing power module using the at least one mounting aperture.

In another aspect, the present disclosure relates to a cooling adapter comprising a housing comprising at least one mounting aperture and including at least one cooling manifold comprising an inlet plenum having at least one inlet for entry of a cooling fluid, an outlet plenum having at least one outlet for exhausting the cooling fluid, a plurality of parallel channels disposed parallel to and between the inlet plenum and the outlet plenum, and a plurality of orthogonal channels disposed perpendicular to and extending between the inlet plenum and the outlet plenum, wherein the plurality of parallel channels and orthogonal channels are interconnected for allowing the cooling fluid to move therebetween, wherein the housing is configured to be removably attached to a pre-existing power module using the at least one mounting aperture.

In yet another aspect, the present disclosure relates to a method for cooling a pre-existing power module using a cooling adapter having a cooling manifold, the method comprising introducing a cooling fluid flow through an inlet plenum in the cooling manifold and having at least one inlet, distributing the cooling fluid flow to a plurality of interconnected channels disposed within the cooling manifold and oriented both perpendicular to and parallel with the inlet plenum, and exhausting the cooling fluid flow through an outlet plenum in the cooling manifold and having at least one outlet.

DETAILED DESCRIPTION OF THE INVENTION

Figure 1:
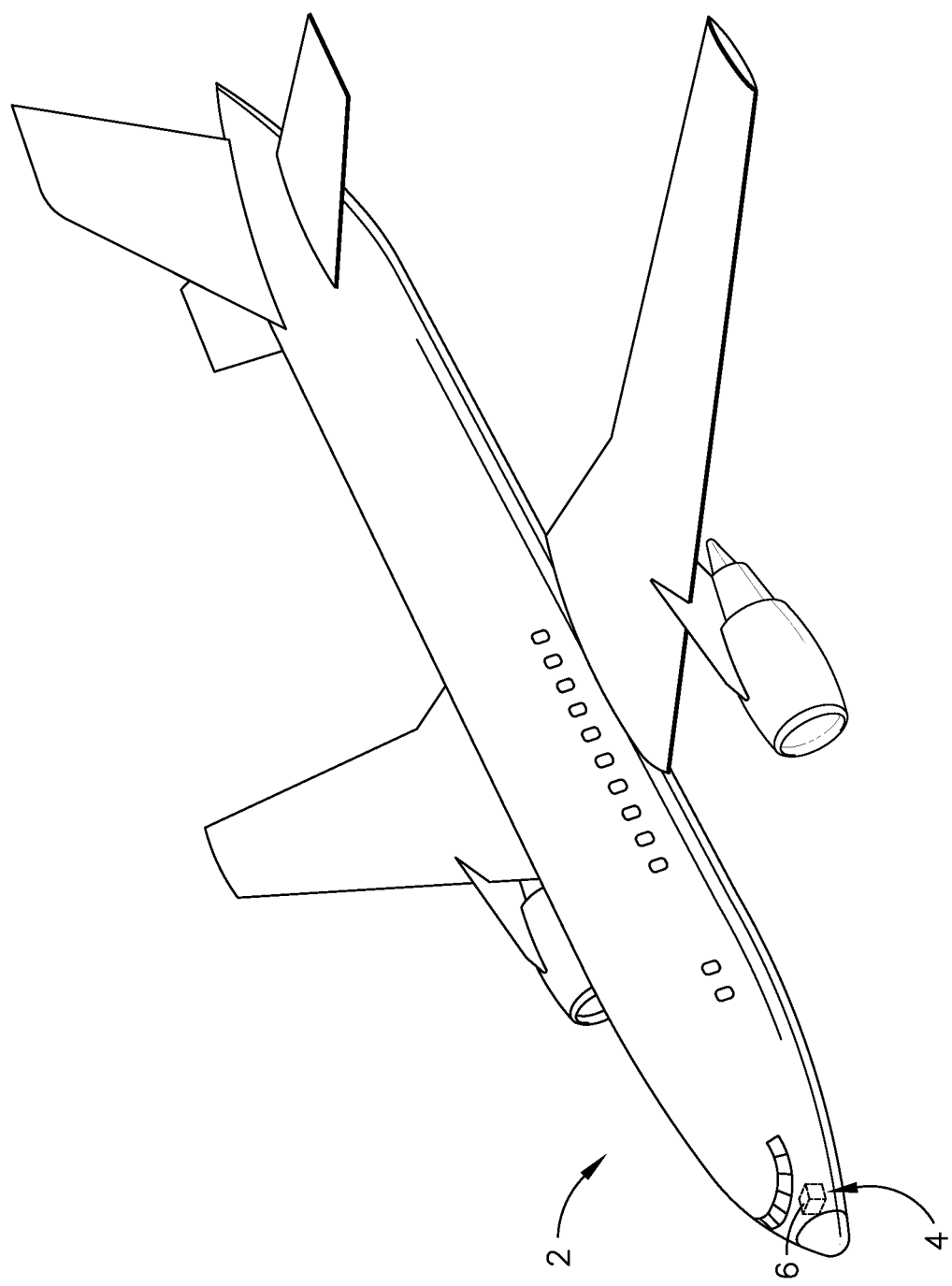
FIG. 1 is a perspective view of an aircraft having an electronics chassis including an avionics system in accordance with various aspects described herein.

Aspects of the disclosure described herein are directed to a cooling adapter for a power module formed to attach to a pre-existing electronic module. For purposes of illustration, the present disclosure will be described with respect to a cooling adapter for cooling a power module including a base plate, substrate, and electronic module, or computer chip. It will be understood, however, that aspects of the disclosure described herein are not so limited and may have general applicability within the field of electronics.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are only used for identification purposes to aid the reader's understanding of the present disclosure, and do not create limitations, particularly as to the position, orientation, or use of aspects of the disclosure described herein. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary. As used herein, the term "set" or a "set" of elements can be any number of elements, including only one.

FIG. 1 schematically illustrates an aircraft 2 with an avionics system 4, illustrated as an on-board electronics chassis 6 (shown in phantom) for housing avionics or avionic components for use in the operation of the aircraft 2. It will be understood that the avionics system 4 can include a thermal management member having heat spreaders, heat sinks, heat exchangers, radiators, or heat pipes in non-limiting examples. The electronics chassis 6 can house a variety of power modules for avionics electronic devices and protects against contaminants, electromagnetic interference (EMI), radio frequency interference (RFI), vibrations, and the like. Alternatively or additionally, the electronics chassis 6 can have a variety of avionics mounted thereon. It will be understood that the electronics chassis 6 can be located anywhere within the aircraft 2, not just the nose as illustrated.

While illustrated in a commercial airliner, the electronics chassis 6 can be used in any type of aircraft, for example, without limitation, fixed-wing, rotating-wing, rocket, commercial aircraft, personal aircraft, and military aircraft. Furthermore, aspects of the disclosure are not limited only to aircraft aspects, and can be included in other mobile and stationary configurations. Non-limiting example mobile configurations can include ground-based, water-based, or additional air-based vehicles.

Figure 2:
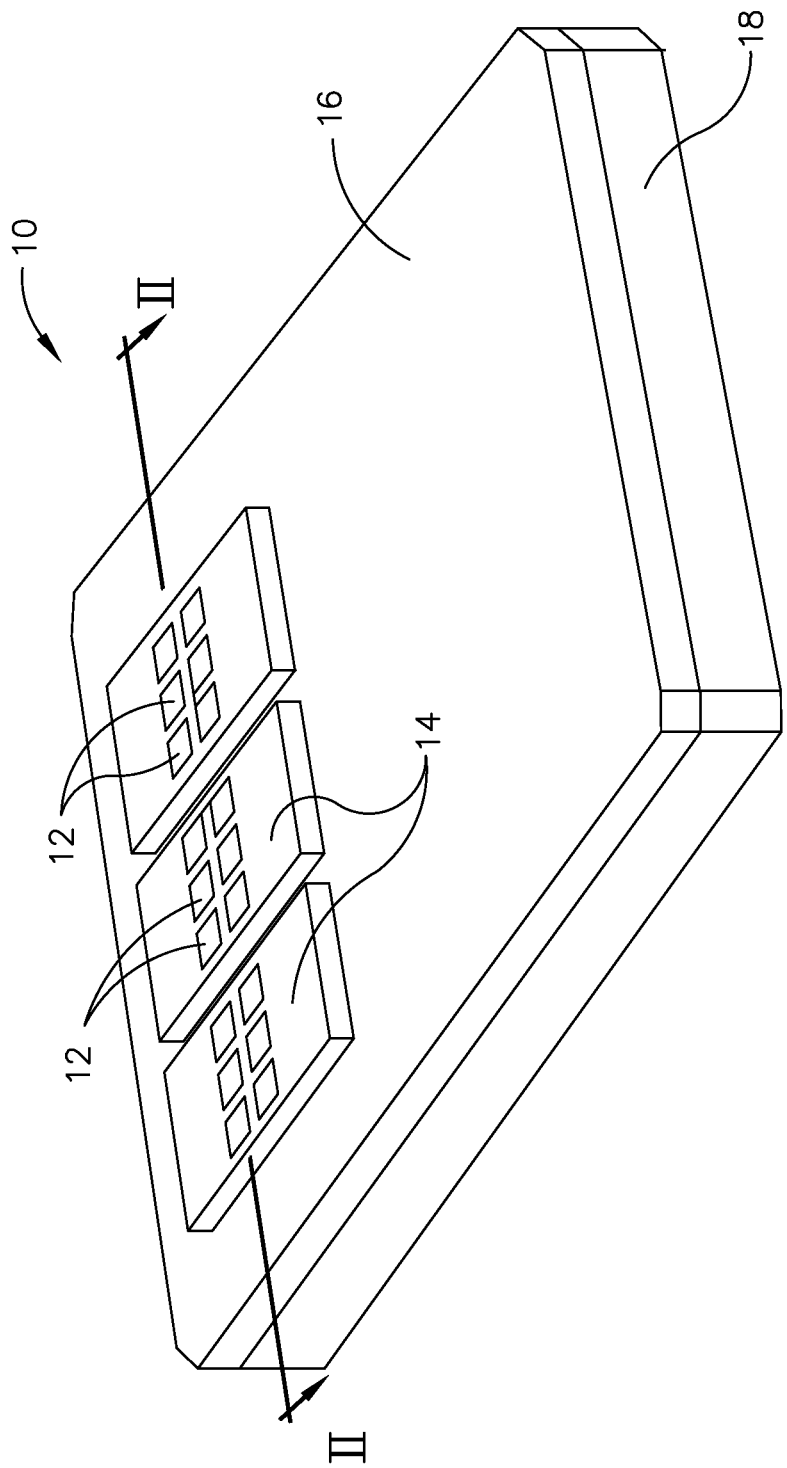
FIG. 2 is a perspective view of a schematic of a pre-existing power module mounted to a cooling adapter that can be located within the electronics chassis of FIG. 1.

FIG. 2 is a pre-existing power module 10 including an electronic device 12, a substrate 14, and a base plate 16. The pre-existing power module 10 can be located in the electronics chassis 6 (FIG. 1). In an aspect of the disclosure herein the electronic device 12 is standardized such as a commercial off the shelf (COTS) part so that the shape, holes, and features of the electronic device 12 are matched to the base plate 16. Non-limiting examples of the electronic device 12 can include insulated gate bipolar Transistors (IGBT), metal oxide semiconductor field effect transistors (MOSFET), diodes, metal semiconductor field effect transistors (MESFET), and high electron mobility transistors (HEMT) used for applications not limited to avionics applications, automotive applications, oil and gas applications, or the like. According to aspects of the disclosure herein, the electronic device 12 can be manufactured from a variety of semiconductors, non-limiting examples of which include silicon, silicon carbide, gallium nitride, and gallium arsenide. The electronic device 12 can generate heat during operation. The pre-existing power module 10 is mounted to a cooling adapter 18.

The substrate 14 can be provided to avoid electrical short circuits and to perform heat exchange between the base plate 16 and the electronic device 12. In an aspect of the disclosure herein, the substrate 14 is an electrically isolating and thermally conductive layer, such as a ceramic layer. Non-limiting examples of the ceramic layer can include aluminum oxide, aluminum nitride, beryllium oxide, and silicon nitride. In one non-limiting example, the base plate 16 can be directly bonded to the substrate 14. The substrate 14 can be coupled to the base plate 16 and the electronic device 12 using a number of techniques, including but not limited to, brazing, bonding, diffusion bonding, soldering, or pressure contact such as clamping to provide a simple assembly process. It should be noted herein that the exemplary arrangement described with respect to FIG. 2 is for illustrative purposes only and not meant to be limiting.

Typically, a base plate and a heat sink are interconnected with a thin layer of thermal interface material (TIM) in between, which can limit the power module performance and reduce system reliability due to cracking and degradation of the TIM. In an aspect of the disclosure herein, the base plate 16 can be made of a metal or metal matrix composite (MMC), and can be coupled to the cooling adapter 18 without using TIM. The MMC can include but is not limited to aluminum, copper, aluminum-SiC, aluminum-graphite. The manner in which the base plate 16 contacts the cooling adapter 18 enables direct cooling to the base plate 16 from cooling fluid within the cooling adapter 18. The base plate 16 as described herein is part of the pre-existing power module 10. Contact between the base plate 16 of a pre-existing power module 10 and the cooling adapter 18 can improve thermal dissipation and reliability of the pre-existing power module 10.

Figure 3:
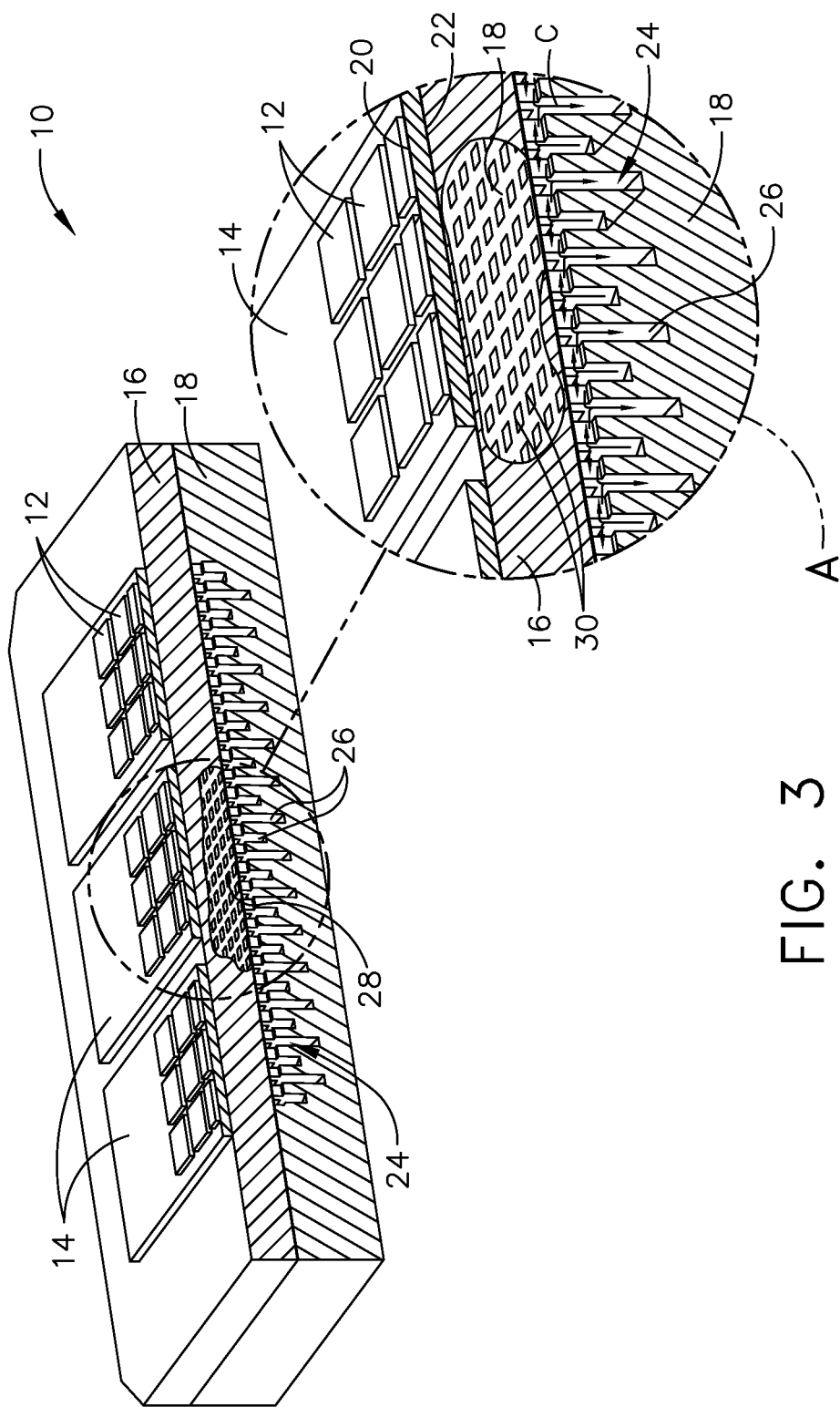
FIG. 3 is a cross-section of the pre-existing power module mounted to the cooling adapter taken along line II-II of FIG. 2 with an enlarged portion A illustrating details of a cooling manifold located within the cooling adapter and a flow of coolant perpendicular to and extending between the inlet and outlet manifold channels.

FIG. 3 is a cross-section of the pre-existing power module 10 of FIG. 2 along line II-II and includes an enlarged portion (A). In another aspect of the disclosure, and more clearly illustrated in the enlarged portion (A) of FIG. 1, the substrate 14 can be bonded to the base plate 16 and the electronic device 12 via top and bottom conductive layers 20, 22, by way of non-limiting example copper layers. The substrate 14 can have either a direct bonded copper (DBC), or an active metal braze (AMB) structure. In other words, the top conductive layer 20 can be disposed between the electronic device 12 and the substrate 14 and the bottom conductive layer 22 can be disposed between the substrate 14 and the base plate 16. In another aspect of the disclosure herein, an aluminum layer, a gold layer, a silver layer, or an alloy layer can be preferred instead of the copper layer.

At least one cooling manifold 24 is provided within the cooling adapter 18 and includes a plurality of channels 26, illustrated, by way of non-limiting example, as millichannels. A portion of the base plate 16 is cutaway in the cross-section to illustrate an opened manifold plane 28 of the cooling adapter 18. More clearly illustrated in the enlarged portion (A), the opened manifold plane 28 is formed by the channels 26 intersecting to create spaced cavities 30 of a substantially square-like shape that extend perpendicularly inward from the opened manifold plane 28. In this manner the plurality of channels 26 are interconnected. It should be understood that any shape can result from the interconnected channels 26, and that the square-like shapes are for illustrative purposes and not meant to be limiting.

In an aspect of the disclosure herein, a cooling fluid (C) flows through the plurality of channels to cool the pre-existing power module 10. The cooling fluid (C) can be any suitable cooling fluid, by way of non-limiting example a mixture of propylene glycol and water. Preferably, the cooling fluid (C) can include 60 percent by weight of propylene glycol and 40 percent by weight of water. The cooling fluid (C) can also include other electrically conductive or non-electrically conductive liquids. It is further contemplated that the cooling fluid (C) can include a gaseous medium. Accordingly, when the electronic device 12 and the base plate 16 are disposed on the cooling adapter 18, the cooling fluid (C) flowing through the at least one cooling manifold 24 of the cooling adapter 18 provides cooling of the electronic device 12.

Figure 4:
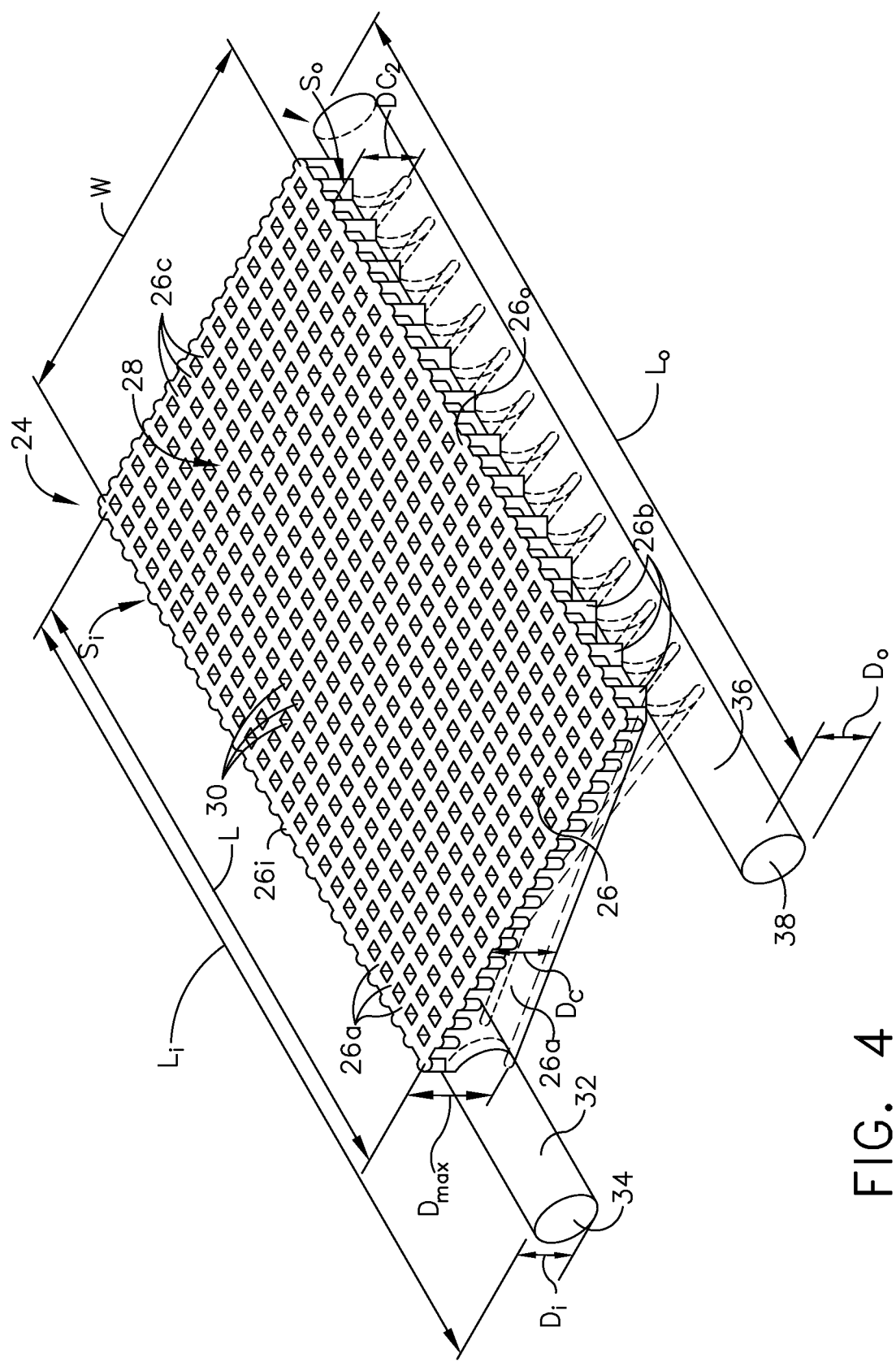
FIG. 4 is a perspective top view of the cooling manifold of FIG. 3.

FIG. 4 is a top perspective view of the at least one cooling manifold 24. The at least one cooling manifold 24 can define a length (L) and a width (W) and for illustrative purposes be substantially rectangular in shape having a first or inlet side ($S_i$) and a second or outlet side ($S_o$) separated by the width (W). An inlet plenum 32 extends from at least one inlet 34 having a diameter ($D_i$) along the inlet side ($S_i$) and can define a length ($L_i$) that is equal to or greater than the length (L) of the at least one cooling manifold 24. An outlet plenum 36 extends from at least one outlet 38 along the outlet side ($S_o$) and can define a length ($L_o$) that is equal to or greater than the length (L) of the at least one cooling manifold 24. The at least one outlet 38 can define a diameter ($D_o$) that is equal to or different than the diameter ($D_i$) of the at least one inlet 34.

The plurality of channels 26 includes a first set of orthogonal channels 26a, fluidly coupled with the inlet plenum 32 at the inlet plenum 32 and extending orthogonally to the outlet plenum 36 to form a portion of the opened manifold plane 28. The first set of orthogonal channels 26a are fluidly coupled to the inlet plenum 32 and are not directly fluidly coupled to the outlet plenum 36 at the outlet plenum 36 and can otherwise be defined as inlet manifold channels 26a. The first set of orthogonal channels 26a can have a depth ($D_c$) and as the first set of orthogonal channels 26a approaches the outlet plenum 36, the depth ($D_c$) decreases. In one aspect of the disclosure herein the depth ($D_{c1}$) of the first set of orthogonal channels 26a at the inlet plenum 32 defines a maximum depth ($D_{max}$) of the at least one cooling manifold 24. In an aspect of the disclosure herein, the maximum depth ($D_{max}$) can be equal to or less than the diameter ($D_i$) of the inlet plenum 32.

The plurality of channels 26 includes a second set of orthogonal channels 26b forming a portion of the opened manifold plane 28 and fluidly coupled to the outlet plenum 36. The second set of orthogonal channels 26b extend orthogonally to the inlet plenum 32 and are not directly fluidly coupled to the inlet plenum 32 at the inlet plenum 32. The second set of orthogonal channels 26b are directly fluidly coupled to the outlet plenum 36 and can otherwise be defined as outlet manifold channels 26b. The second set of orthogonal channels 26b alternates between and is parallel to the first set of orthogonal channels 26a to form the open manifold plane 28. It is contemplated that the second set of orthogonal channels 26b also defines a channel depth ($D_{c2}$) that can define the maximum depth ($D_{max}$) of the at least one cooling manifold 24. In one aspect of the disclosure herein the maximum depth ($D_{max}$) can be equal to or less than the diameter ($D_o$) of the outlet plenum 36. Together the first and second sets of orthogonal channels 26a, 26b define a bulk of the width (W) of the at least one cooling manifold 24.

A set of parallel channels 26c extends along the length (L) of the at least one cooling manifold 24 orthogonally between the first and second sets of orthogonal channels 26a, 26b to further define the opened manifold plane 28 as previously described herein. The set of parallel channels 26c can be disposed parallel to and in between the inlet plenum 34 and the outlet plenum 36. The set of parallel channels 26c cross the first and second sets of orthogonal channels 26a, 26b to form the spaced cavities 30 such that the first and second set of orthogonal channels 26a, 26b are interconnected with the set of parallel channels 26c. Preferably the spaced cavities are the same width of channel 26a and 26b and the same depth as the width, such that the opened manifold plane 28 formed emulates a waffle pattern. At least two channels 26i, 26o, of the set of parallel channels 26c extend along a bulk of the length (L) proximate the inlet plenum 32 and the outlet plenum 36 respectively. These at least two channels 26i, 26o are directly connected to the inlet plenum 32 and the outlet plenum 36 respectively. The plurality of channels 26 defines the open manifold plane 28 as an interconnected channels including the first and second set of orthogonal channels 26a, 26b and the set of parallel channels 26c.

In aspects of the disclosure herein, the plurality of channels 26 can have a rectangular or square cross-section. Non-limiting examples of the cross sectional area shape of the plurality of channels 26 can include circular, triangular, trapezoidal, and u-shaped cross-sections. The plurality of channels 26 can be cast, machined, 3D printed, or etched, and can be smooth or rough in the cooling adapter 18. Roughened channels 26 can have a relatively large surface area to enhance turbulence of the cooling fluid so as to augment thermal transfer therein. In non-limiting examples, the plurality of channels 26 can include features such as dimples, bumps, or the like to increase the roughness thereof. Furthermore, the geometry of the plenums 32, 36, and the plurality of channels 26 can be designed based on the application, type of cooling medium used, and the ambient temperature. The number of channels 26 can vary depending on the application.

Figure 5:
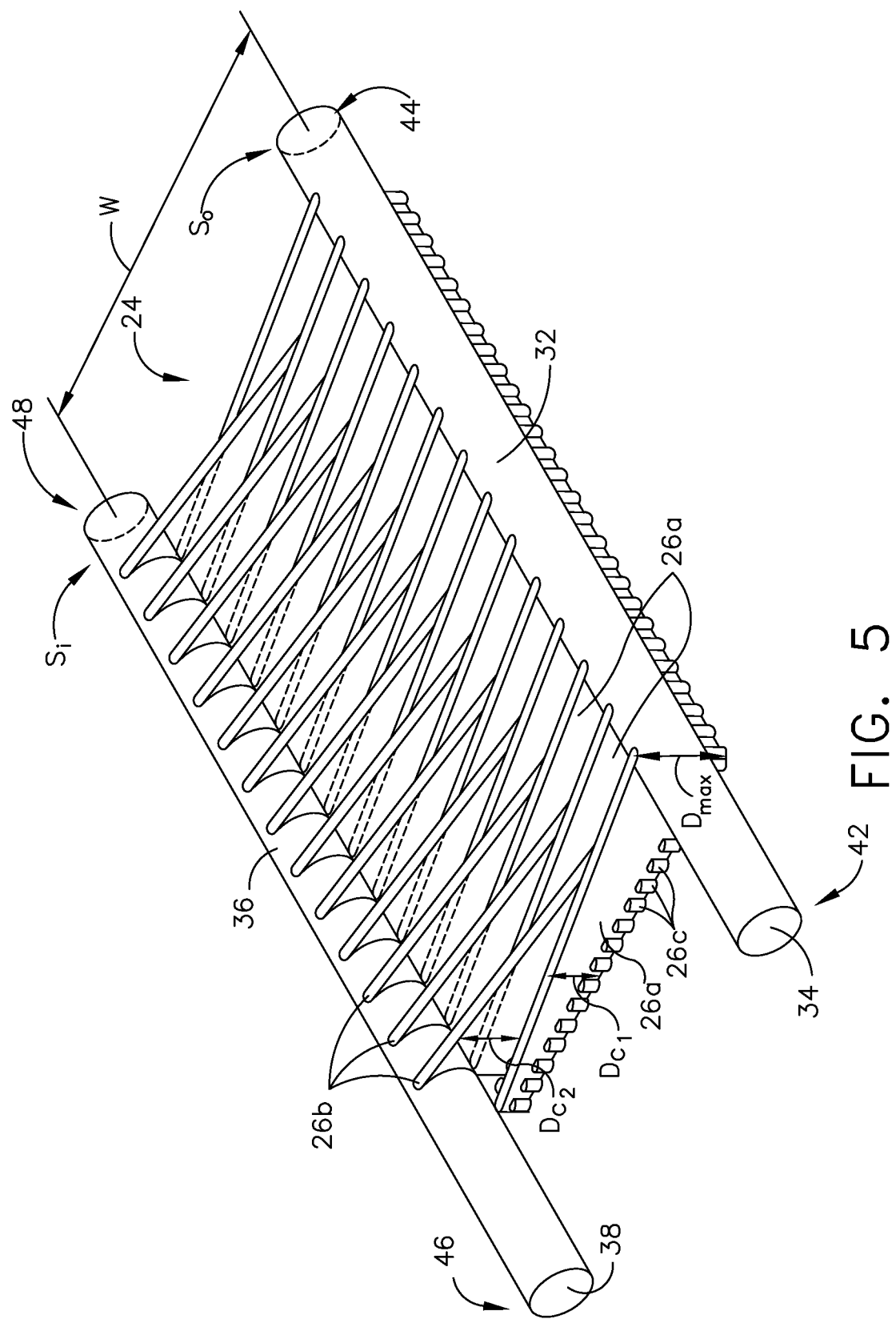
FIG. 5 is a perspective bottom view of the cooling manifold of FIG. 4.

FIG. 5 is a flipped bottom perspective view of the at least one cooling manifold 24 more clearly illustrating the first and second set of orthogonal channels 26a, 26b. It is more clearly shown that the first set of inlet manifold channels 26a interconnected with the inlet plenum 32 and extending orthogonally a full width (W) from the inlet plenum 32 to the outlet plenum 36, and a second set of outlet manifold channels 26b interconnected with the outlet plenum 36 and extending orthogonally extend a full width (W) from the outlet plenum 36 to the inlet plenum 32. The first set of inlet manifold channels 26a and the second set of outlet manifold channels 26b alternate such that each of the channels 26a, 26b can define the maximum depth ($D_{max}$) of the at least one cooling manifold 24 at either the inlet or outlet plenums 32, 36 respectively. It is contemplated that this depth is the same for each of the first and second set of orthogonal channels 26a, 26b.

It is further contemplated that the at least one inlet 34 can be located at a first end 42 or second end 44 of the inlet plenum 32. Likewise, the at least one outlet 38 can be located at a first end 46 or second end 48 of the outlet plenum 36. The location of the at least one inlet 34 and the at least one outlet 38 as shown is for illustrative purposes only and not meant to be limiting.

Figure 6:
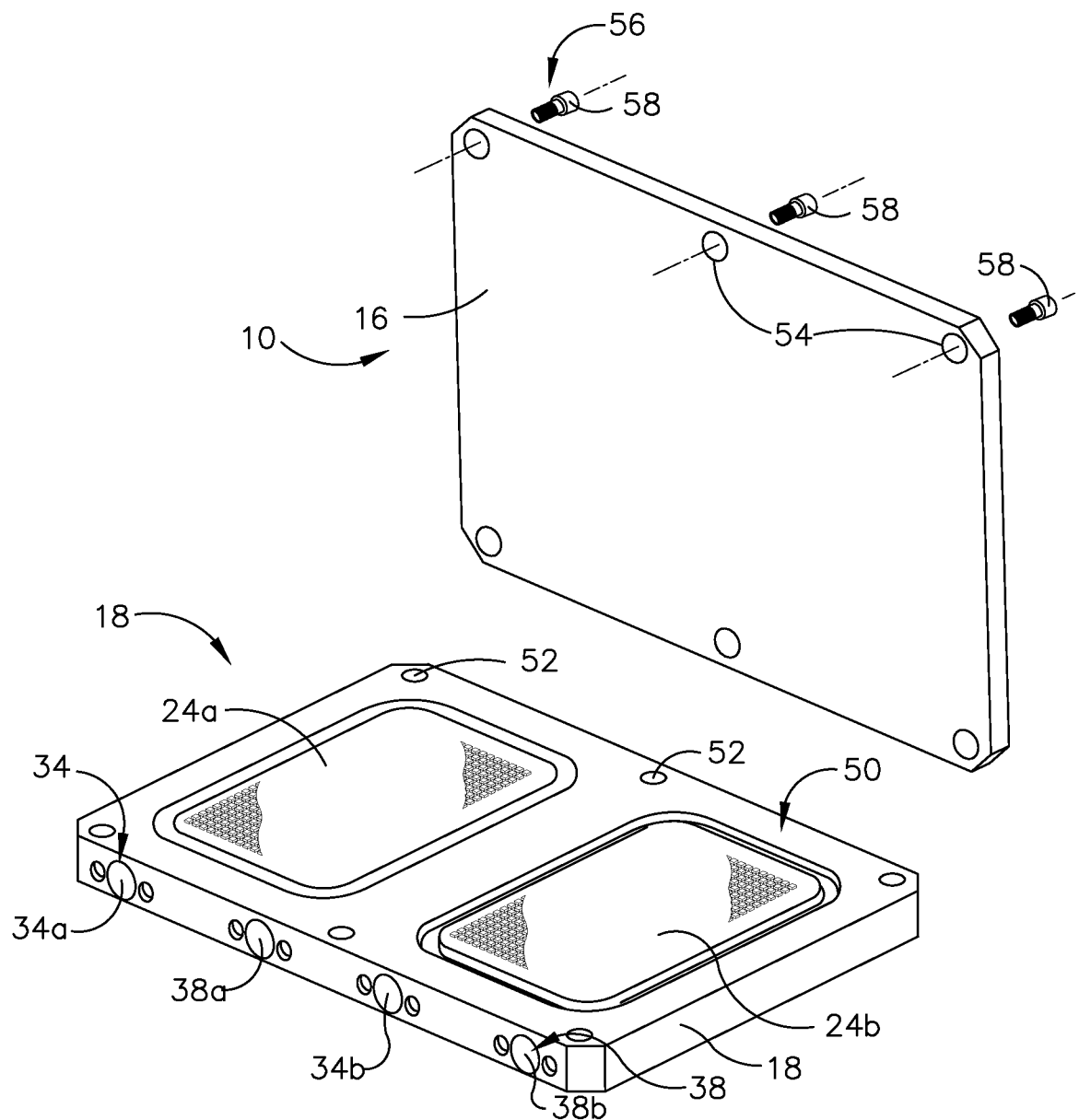
FIG. 6 is a perspective view of the pre-existing power module detached from the cooling adapter.

FIG. 6 is a perspective view of the pre-existing power module 10 with the base plate 16 removed separated from the cooling adapter 18. The cooling adapter 18 includes a housing 50 formed from, by way of non-limiting example, aluminum, copper or plastic, and can be manufactured using 3D printing, molding, or machining. In this manner, the housing 50 is a singular modular piece removable from the pre-existing module 10. The housing 50 can be standardized so that the shape, holes and features of the cooling adapter 18 are matched to the base plate 16 of the pre-existing power module 10. The housing 50 can be formed to include at least one mounting aperture 52 to enable the cooling adapter 18 to be removably attached to the base plate 16 at a corresponding at least one mounting aperture, or base plate hole 54, with fasteners 56, by way of non-limiting example screws 58. The base plate 16 is part of the pre-existing power module 10 and the housing 50 is adaptable such that the cooling adapter 18 can be affixed to the base plate 16 of any pre-existing power module 10.

The housing 50 as illustrated includes at least one cooling manifold 24 as described herein. For illustrative purposes, two cooling manifolds, a first cooling manifold 24a and a second cooling manifold 24b, are provided within the cooling adapter 18. The first and second cooling manifolds 24a, 24b are configured to receive the cooling fluid (C) via the at least one inlet 34 and to exhaust the cooling fluid (C) via the at least one outlet 38. By way of non-limiting example the first cooling manifold 24a includes inlet 34a and outlet 38a and the second cooling manifold 24b includes inlet 34b and outlet 38b.

Figure 7:
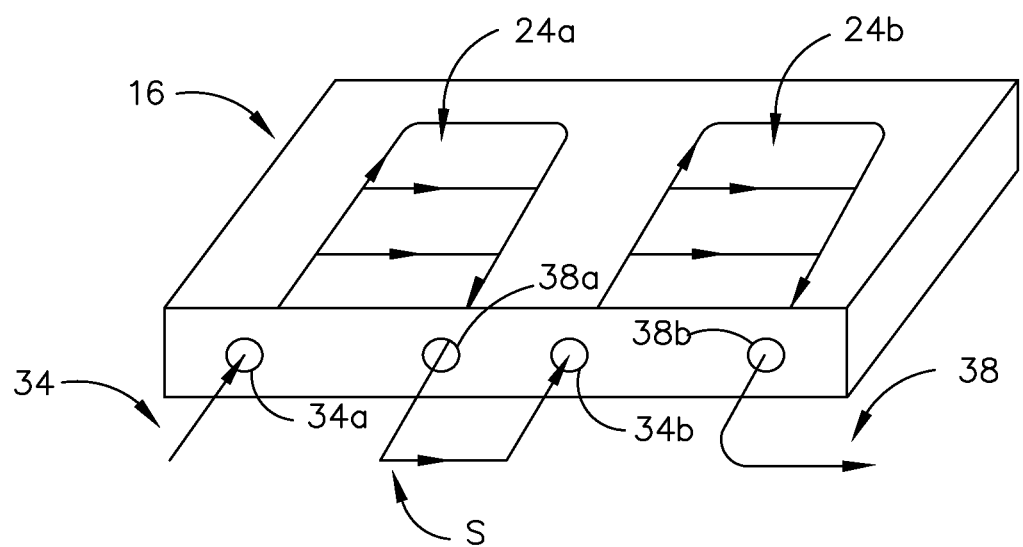
FIG. 7 is a schematic of the cooling adapter of FIG. 6 illustrating a series connection according to an aspect of the disclosure herein.

Turning to FIG. 7 a schematic of the cooling adapter 18 is illustrated. In an aspect of the disclosure herein, the at least one inlet 34 and the at least one outlet 38 can be connected in series. Cooling manifold 24a can receive cooling fluid (C) via inlet 34a and exhaust the cooling fluid (C) through outlet 38a. Through a series connection (S), outlet 38a is directly connected to inlet 34b of cooling manifold 24b. In this exemplary series connection (S), cooling fluid (C) flows through cooling manifold 24a and then through cooling manifold 24b. A series connection (S) can be utilized in a lower flow rate requirement pre-existing power module 10.

Figure 8:
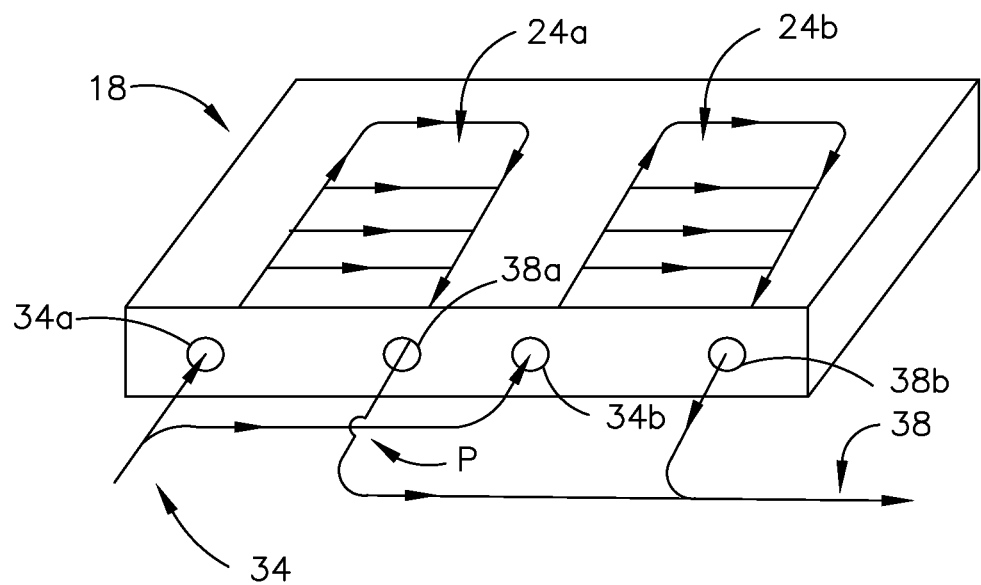
FIG. 8 is a schematic of the cooling adapter of FIG. 6 illustrating a parallel connection according to another aspect of the disclosure herein.

As illustrated in FIG. 8, in another aspect of the disclosure herein, the at least one inlet 34 and the at least one outlet 38 can be connected in parallel. First and second cooling manifolds 24a, 24b can each receive the cooling fluid (C) via inlets 34a, 34b and each separately exhaust the cooling fluid (C) through outlets 38a, 38b. In this exemplary parallel connection (P) cooling fluid (C) flows into each inlet 34a, 34b and likewise each cooling manifold 24a, 24b separately. The cooling fluid (C) is also exhausted via each outlet 38a, 38b and likewise each cooling manifold 24a, 24b separately. It is contemplated that the inlets 34a, 34b and the outlets 38a, 38b are coupled to a single source upstream and downstream respectively. A parallel connection (P) can be utilized in a lower pressure drop requirement pre-existing power module 10.

Figure 9:
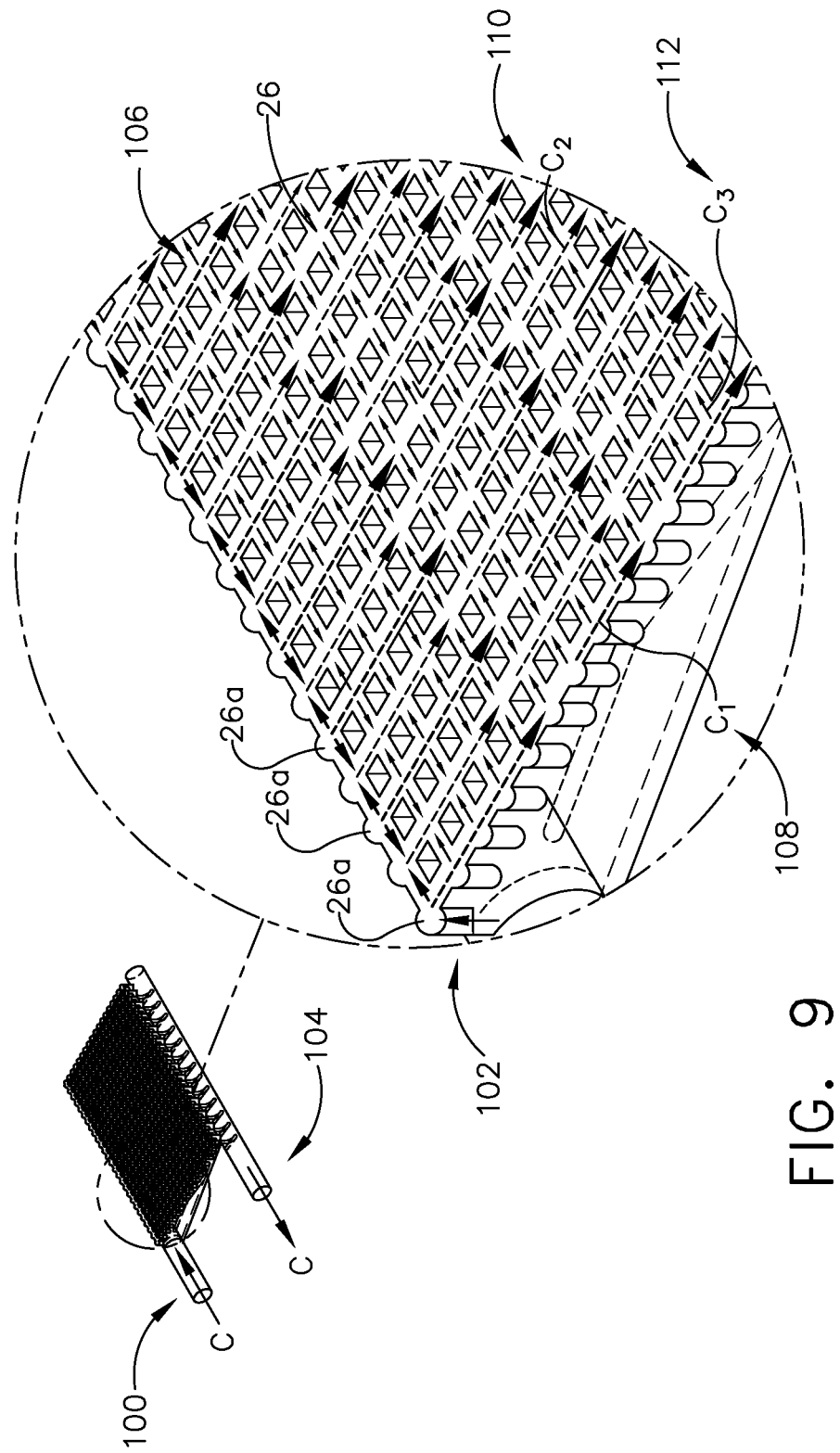
FIG. 9 is a perspective view of the cooling manifold of FIG. 4 with an enlarged portion illustrating a flow of cooling fluid through a plurality of channels within the cooling manifold.

A method for cooling the pre-existing power module 10 is best described utilizing FIG. 9. The method includes at 100 introducing a cooling fluid flow, by way of non-limiting example the cooling fluid (C) as described herein, through the at least one inlet 34. At 102 distributing the cooling fluid flow (C), by way of non-limiting example via the inlet manifold channels 26a, to the plurality of interconnected channels 26 as described herein. The method further includes at 104 exhausting the cooling fluid flow (C) from the at least one outlet 38. It should be understood that the cooling fluid flow (C) that is exhausted from the at least one outlet 38 is relatively hotter than the cooling fluid flow (C) that was introduced to the at least one inlet 34 due to a heat exchange between the base plate 16 and the cooling adapter 18. The pre-existing power module 10 is therefore cooled.

The method can further include at 106 redistributing the cooling fluid flow (C) among multiple sets of channels, by way of non-limiting example the first and second set of orthogonal channels 26a, 26b and the set of parallel channels 26c as described herein. The method can further include at 108 flowing a first portion of the cooling fluid flow ($C_1$) along the first set of orthogonal channels 26a, and at 110 flowing a second portion of the cooling fluid flow ($C_2$) along the second set of orthogonal channels 26b. It is further contemplated that the method can include at 112 splitting a third portion of cooling fluid flow ($C_3$), from the first portion of cooling fluid flow ($C_1$) to flow along the set of parallel channels 26c and exit into the second set of orthogonal channels 26b to form the second portion of cooling fluid flow ($C_2$).

Utilizing the cooling adapter as described herein provides an increase in heat transfer coefficient when compared to utilizing a power module with a known cold plate rather than the cooling adapter. This increase in heat transfer coefficient provides for a significantly reduced temperature rise in the electronic modules. The method as described herein provides a 30 to 40% reduction of the thermal resistivity from the electronic device to the cooling fluid (C). This reduction can enable an increase in the maximum current rating for an existing power module.

Another benefit associated with the cooling adapter 18 as described herein is the interchangeability of the cooling adapter 18 as described herein with pre-existing power modules. In this respect, the cooling adapter can be used to replace portions of a pre-existing power module without having to replace an entire power module. This provides an added cost benefit.

This written description uses examples to describe aspects of the disclosure described herein, including the best mode, and also to enable any person skilled in the art to practice aspects of the disclosure, including making and using any devices or systems and performing any incorporated methods. The patentable scope of aspects of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A cooling adapter for an avionics system comprising:
  a housing in the form of a singular modular piece comprising:
    at least one mounting aperture; and
    at least one cooling manifold comprising:
      an inlet plenum extending a plenum length having at least one inlet for entry of a cooling fluid,
      an outlet plenum located parallel to and spaced from the inlet plenum having at least one outlet for exhausting the cooling fluid, and
      a plurality of channels disposed between the inlet plenum and the outlet plenum defining a manifold plane for allowing the cooling fluid to move therebetween with a first portion of the plurality of channels fluidly connected to the inlet plenum to define at least one inlet manifold channel, a second portion of the plurality of channels fluidly connected to the outlet plenum to define at least one outlet manifold channel, and a third portion of the plurality of channels are disposed parallel to the inlet plenum and the outlet plenum to form a set of parallel channels, comprising one or more of:
        a first channel extending along a bulk of the plenum length and intersecting with the at least one inlet manifold channel in a same plane as the manifold plane; and
        a second channel extending along a bulk of the plenum length and intersecting with the at least one outlet manifold channel in the same plane as the manifold plane;
  wherein the housing is configured to be removably attached to a pre-existing power module using the at least one mounting aperture.

2. The cooling adapter of claim 1 wherein the at least one inlet manifold channel and the at least one outlet manifold channel are coupled orthogonal to the inlet plenum and the outlet plenum to form a plurality of orthogonal channels.

3. The cooling adapter of claim 2 wherein the plurality of orthogonal and parallel channels interconnect to form interconnected channels.

4. The cooling adapter of claim 3 wherein the plurality of orthogonal and parallel channels are millichannels.

5. The cooling adapter of claim 1 wherein the housing is made from aluminum, copper or plastic.

6. The cooling adapter of claim 1 wherein the pre-existing power module comprises a base plate, a substrate, and at least one electronic device mounted on the substrate.

7. The cooling adapter of claim 6 wherein the base plate comprises at least one mounting aperture in alignment with the at least one mounting aperture on the housing.

8. The cooling adapter of claim 7 further comprising a fastener for removably securing the base plate to the cooling adapter.

9. The cooling adapter of claim 1 wherein the at least one cooling manifold comprises two cooling manifolds, a first cooling manifold and a second cooling manifold.

10. The cooling adapter of claim 9 wherein the second cooling manifold also comprises:
an inlet plenum having at least one inlet for entry of the cooling fluid,
an outlet plenum having at least one outlet for exhausting the cooling fluid, and
a plurality of channels disposed between the inlet plenum and the outlet plenum for allowing the cooling fluid to move therebetween.

11. The cooling adapter of claim 10 wherein the outlet of the first cooling manifold is connected to the inlet of the second cooling manifold to form a series connection between the first and second cooling manifolds.

12. The cooling adapter of claim 10 wherein inlet of the first cooling manifold is fluidly connected to the inlet of the second cooling manifold and the outlet of the first cooling manifold is fluidly connected to the outlet of the second cooling manifold to form a parallel connection between the first and second cooling manifolds.

13. The cooling adapter of claim 2, wherein the at least one inlet manifold channel is a first set of orthogonal channels directly fluidly coupled to the inlet plenum and the at least one outlet manifold channel is a second set of orthogonal channels directly fluidly coupled to the outlet plenum where the second set of orthogonal channels alternates between and is parallel to the first set of orthogonal channels.

14. A cooling adapter comprising:
a housing in the form of a singular modular piece having at least one mounting aperture and comprising:
a first cooling manifold comprising:
an inlet plenum having at least one inlet for entry of a cooling fluid,
an outlet plenum having at least one outlet for exhausting the cooling fluid,
a plurality of parallel channels disposed parallel to and between the inlet plenum and the outlet plenum, and
a plurality of orthogonal channels disposed perpendicular to and extending between the inlet plenum and the outlet plenum, wherein the plurality of parallel channels and orthogonal channels are interconnected for allowing the cooling fluid to move therebetween; and
a second cooling manifold comprising:
an inlet plenum having at least one inlet for entry of the cooling fluid,
an outlet plenum having at least one outlet for exhausting the cooling fluid,
a plurality of parallel channels disposed parallel to and between the inlet plenum and the outlet plenum, and
a plurality of orthogonal channels disposed perpendicular to and extending between the inlet plenum and the outlet plenum, wherein the plurality of parallel channels and orthogonal channels are interconnected for allowing the cooling fluid to move therebetween;
wherein the outlet of the first cooling manifold is connected to the inlet of the second cooling manifold to form a series connection between the first and second cooling manifolds; and
wherein the housing is configured to be removably attached to a pre-existing power module using the at least one mounting aperture.

15. The cooling adapter of claim 14, wherein the plurality of parallel channels and the plurality of orthogonal channels are millichannels.

16. The cooling adapter of claim 14, wherein the pre-existing power module comprises a base plate, a substrate, and at least one electronic device mounted on the substrate.

17. The cooling adapter of claim 16, further comprising a fastener for removably securing the base plate to the cooling adapter.

18. A cooling adapter comprising:
a housing in the form of a singular modular piece having at least one mounting aperture and comprising:
a first cooling manifold comprising:
an inlet plenum having at least one inlet for entry of a cooling fluid,
an outlet plenum having at least one outlet for exhausting the cooling fluid,
a plurality of parallel channels disposed parallel to and between the inlet plenum and the outlet plenum, and
a plurality of orthogonal channels disposed perpendicular to and extending between the inlet plenum and the outlet plenum, wherein the plurality of parallel channels and orthogonal channels are interconnected for allowing the cooling fluid to move therebetween; and
a second cooling manifold comprising:
an inlet plenum having at least one inlet for entry of the cooling fluid,
an outlet plenum having at least one outlet for exhausting the cooling fluid,
a plurality of parallel channels disposed parallel to and between the inlet plenum and the outlet plenum, and
a plurality of orthogonal channels disposed perpendicular to and extending between the inlet plenum and the outlet plenum, wherein the plurality of parallel channels and orthogonal channels are interconnected for allowing the cooling fluid to move therebetween; and
wherein inlet of the first cooling manifold is fluidly connected to the inlet of the second cooling manifold and the outlet of the first cooling manifold is fluidly connected to the outlet of the second cooling manifold to form a parallel connection between the first and second cooling manifolds,
wherein the housing is configured to be removably attached to a pre-existing power module using the at least one mounting aperture.

19. The cooling adapter of claim 18, wherein the plurality of parallel channels and the plurality of orthogonal channels are millichannels.

20. The cooling adapter of claim 18, wherein the pre-existing power module comprises a base plate, a substrate, and at least one electronic device mounted on the substrate.

21. The cooling adapter of claim 20, further comprising a fastener for removably securing the base plate to the cooling adapter.

22. A method for cooling a pre-existing power module using the cooling adapter of claim 1, the method comprising:
   introducing the cooling fluid flow through the inlet plenum in the cooling manifold,
   distributing the cooling fluid flow from the inlet plenum to the plurality of channels disposed within the cooling manifold, and
   exhausting the cooling fluid flow from the plurality of channels through the outlet plenum in the cooling manifold.

23. The method of claim 22, further comprising redistributing the cooling fluid flow among multiple sets of channels in the plurality of channels.

24. The method of claim 22, further comprising flowing a first portion of the cooling fluid flow along a first set of channels perpendicular to the inlet plenum and flowing a second portion of the cooling fluid flow along a second set of channels perpendicular to the outlet plenum.

25. The method of claim 24, further comprising splitting a third portion of the cooling fluid flow from the first portion of the cooling fluid flow to form the second portion of the cooling fluid flow.

* * * * *